(12) United States Patent
Blaesing-Bangert

(10) Patent No.: US 9,354,048 B2
(45) Date of Patent: May 31, 2016

(54) METHOD FOR MEASURING A LITHOGRAPHY MASK OR A MASK BLANK

(71) Applicant: Carl Zeiss SMS GmbH, Jena (DE)

(72) Inventor: Carola Blaesing-Bangert, Rothenstein (DE)

(73) Assignee: Carl Zeiss SMS GmbH, Jena ( * ) Notice: Subject to any disclaimer, the term of this patent is extended or adjusted under 35 U.S.C. 154(b) by 0 days.

(21) Appl. No.: 14/706,623

(22) Filed: May 7, 2015

(65) Prior Publication Data

US 2015/0330777 A1 Nov. 19, 2015

(30) Foreign Application Priority Data

May 19, 2014 (DE) .......................... 10 2014 209 455

(51) Int. Cl.
| | | |
|---|---|---|
| *G01J 1/42* | (2006.01) | |
| *G01B 11/27* | (2006.01) | |
| *G03F 7/20* | (2006.01) | |
| *G01B 11/00* | (2006.01) | |

(52) U.S. Cl.
CPC ............ *G01B 11/272* (2013.01); *G01B 11/005* (2013.01); *G03F 7/70633* (2013.01)

(58) Field of Classification Search
CPC ..... G01B 11/27; G01B 11/00; G01N 21/9501
USPC .............................. 250/372; 356/237.3–237.5
See application file for complete search history.

(56) References Cited

U.S. PATENT DOCUMENTS

| | | |
|---|---|---|
| 2010/0153059 A1 | 6/2010 | Klose et al. |
| 2010/0233593 A1 | 9/2010 | Kim et al. |
| 2011/0205549 A1 | 8/2011 | Hof et al. |
| 2013/0245971 A1* | 9/2013 | Kusunose ............. G01R 31/26 702/59 |

FOREIGN PATENT DOCUMENTS

| | | |
|---|---|---|
| DE | 10 2007 033 814 A1 | 10/2008 |
| WO | WO 2008/071268 A1 | 6/2008 |

OTHER PUBLICATIONS

G. Klose et al., "High-resolution and high-precision pattern placement metrology for the 45 nm node and beyond" (EMLC 2008).
T. Murachi et al., "Fiducial Mark requirements from the viewpoints of Actinic Blank Inspection tool for phase defect mitigation on EUVL Mask", Photomask Technology 2012, Proc SPIE vol. 8522.
Terasawa et al., "Actinic Mask Blank Inspection and Signal Analysis for Detecting Phase Defects Down to 1.5 nm in Height", Japanese Journal of Applied Physics 48, 2009.
German Office Action, with translation thereof, for corresponding DE Appl No. 10 2014 209 455.0, dated Jan. 14, 2015.

* cited by examiner

*Primary Examiner* — David Porta
*Assistant Examiner* — Meenakshi Sahu
(74) *Attorney, Agent, or Firm* — Fish & Richardson P.C.

(57) ABSTRACT

A method for measuring a substrate in the form of a lithography mask or a mask blank for producing a lithography mask comprises the alignment of a substrate coordinate system (SKS), predetermined by a first marker structure, relative to a position measurement system, a measurement of actual position data (IST) of a second marker structure with predetermined intended position data (POS) in the substrate coordinate system (SKS), and an establishment of a transformation (T) of the substrate coordinate system (SKS) into a transformed substrate coordinate system (tSKS), wherein the transformation (T) is established in such a way that deviations between the actual position data (IST) and the intended position data (POS) of the second marker structure are reduced.

21 Claims, 5 Drawing Sheets

METHOD FOR MEASURING A LITHOGRAPHY MASK OR A MASK BLANK

CROSS-REFERENCE TO RELATED APPLICATIONS

Figure 1:
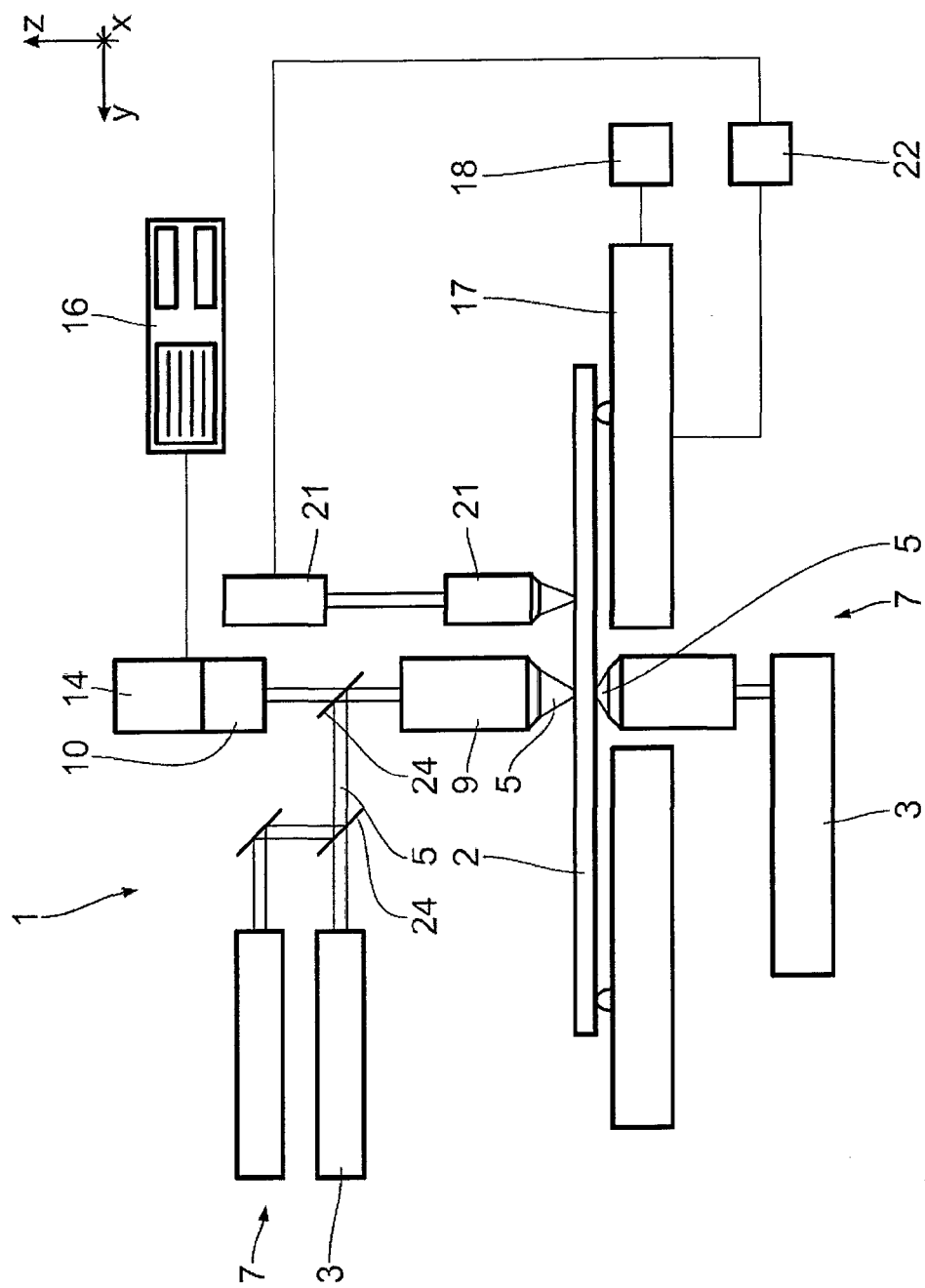

This application claims benefit under 35 U.S.C. §119 to German Application No. 10 2014 209 455.0, filed May 19, 2014, the entire contents of which are hereby incorporated by reference.

The invention relates to a method for measuring a lithography mask or a mask blank for performing such a method. Furthermore, the invention relates to a method for establishing an overlay of two lithography masks and a method for producing a lithography mask. Finally, the invention relates to a position measurement system (registration tool).

Methods for measuring lithography masks are known from US 2013/0 245 971 A1 and US 2010/0 233 593 A1.

Ever more stringent requirements are placed on the precision in microlithography, in particular in view of the lithography masks. In order to produce semiconductor elements in lithography, scanners or steppers are used to project the structures of lithography masks onto wafers, which are coated with a light-sensitive layer—the resist. In order to produce ever smaller structures on the wafer, it is necessary to increase the resolution further during the exposure of the wafer. A high precision makes it necessary to be able to establish the exact arrangement of a structure.

Using a position measurement system (registration tool), special structure elements, which are referred to as a "registration pattern" or as a "mark", are measured on a mask and compared with the intended positions thereof. Positions of structure elements of the mask, which are part of the used structures of the mask, are also measured. This is referred to as "real pattern registration". The deviation between the intended position of a structure element and the actual position thereof on the mask is the positioning error, which is also referred to as "registration" or "registration error".

Measuring the masks allows the positional accuracy of the structures on the mask to be checked via electron beam writers during the writing process of the lithography masks.

The requirements of the measurement when establishing positioning errors lie at 1 nm, but should be improved to down to 0.5 nm in the next generation of instruments. In the case of a given resolution and imaging fidelity of available position measurement systems, these requirements can only be met by applying special methods for evaluating the aerial images.

The wafer is exposed a number of times during the production of semiconductors. Measuring the structures of an existing mask set renders it possible to qualify the deviation of the structure positions for the individual lithographic layers with respect to one another in the various lithography masks. The error or the accuracy in the superposition of a plurality of structures on the wafer is referred to as an overlay. Here, a precision in the nanometer/sub-nanometer range is required, especially in the DUV range and/or EUV range.

The multiple exposure, often double exposure, and the multiple patterning of the lithography masks, often double patterning, serve to increase the resolution of the structures to be imaged on the wafer.

In this method, the overall structure of a layer to be produced on the wafer is subdivided into two or more partial structures, which are formed on a set of different lithography masks.

The requirement of the accuracy of the overlay is further increased in this method.

Therefore the requirements of the accuracy with which the overlay of lithography masks is to be established increase in addition to the requirement of the accuracy of the measurement of lithography masks.

EUV masks are assembled from a base substrate, onto which a multilayer which enables the reflection of the employed illumination radiation at a wavelength of 13.5 nm is applied. Then, an absorber layer is applied onto the multilayer. The structure of a mask to be produced, the mask structure, is then produced by removing the absorber at the necessary points. The base substrate with the multilayer and with an absorber is referred to as a mask blank. Until now, it has not been possible to produce these mask blanks without errors. After producing the masks, they are checked for defects. The positions of the defects are established. The defects are specified in a coordinate system which is defined by markers, so called fiducial marks, on the mask blank. Such fiducial marks are, in particular, arranged on the substrate in accordance with a known industry norm. When producing a mask, an alignment of the predetermined structure on the mask, which is to be produced on the mask blank, is sought-after on the mask blank, in which as many defects as possible are covered by the remaining absorber. This is all the more possible the more precise the location of the defects is known.

Lithography masks and mask blanks are also referred to as substrates in a conflating manner below. The predetermined structure of a mask is referred to as mask design.

It is an object of the present invention to improve a method for measuring a substrate in the form of a lithography mask or a mask blank for producing a lithography mask, which has at least one first marker structure and at least one second marker structure, wherein the at least one first marker structure predetermines a substrate coordinate system. It is moreover an object of the invention to improve a method for establishing an overlay and a method for producing a lithography mask.

These objects are achieved by the methods in accordance with the disclosure. The sequence of the steps is not fixedly predetermined in this case.

The core of the invention consists of providing a multistage method for measuring and/or aligning a substrate, wherein an alignment is initially carried out for aligning a substrate coordinate system relative to the position measurement system, in particular relative to a machine coordinate system, i.e. a coordinate system of the position measurement system. Position data of at least one second marker structure on the substrate are established in this substrate coordinate system. A transformation of the substrate coordinate system, in which intended position data of the second marker structure are predetermined, can be established from the actual position data established in the substrate coordinate system. The transformation defines a substrate coordinate system which is transformed, in particular, relative to the substrate coordinate system.

The transformation is established, in particular, in such a way that deviations between the actual position data and the intended position data of the second marker structure are reduced.

What is understood by this is that the actual position data in the transformed substrate coordinate system has a reduced deviation from the intended position data in the substrate coordinate system. Here, the specification of the actual position data in the substrate coordinate system serves as a reference.

The transformation is preferably established in such a way that the deviation is minimized. It is also possible to specify a criterion for a maximum tolerable deviation and establish the transformation in such a way that this criterion is satisfied or generate corresponding information if this is not possible.

The precision of the position data can substantially be improved by establishing these data of the second marker structure in the substrate coordinate system. In particular, it is possible to improve the accuracy, reproducibility and uncertainty of position data which are measured in the substrate coordinate system.

The substrate can be a mask, in particular a lithography mask, in particular for DUV lithography or EUV lithography. It can also be a mask blank, i.e. a substrate, in particular a substrate yet to be patterned, for producing such a mask. The substrate, in particular the lithography mask, can have a transmissive or reflective embodiment. The lithography mask or the mask blank has at least a first and at least a second marker structure.

The first marker structure comprises, in particular, at least one, in particular at least two or more alignment markers, so-called alignment marks, in particular first alignment marks. Such markers are arranged by the producer on the substrate, in particular on the mask blank or the lithography mask. In the case of a mask blank, these markers can be formed by so-called fiducial marks. Such fiducial marks are, in particular, arranged on the substrate in accordance with a known industry norm.

The second marker structure comprises, in particular, at least one, in particular at least two or more alignment markers, so-called alignment marks, in particular second alignment marks. If these markers are arranged on lithography masks, they are also referred to as scanner alignment markers. In the case of a mask blank, these markers can be formed by fiducial marks.

A position measurement system, as is described in e.g. DE 10 2007 033 814 A1 and in WO 2008/071268 A1, serves to measure the structure. The alignment of the first marker structure serves, in particular, for aligning the substrate coordinate system relative to the position measurement system. The substrate coordinate system is adjusted, in particular, relative to a machine coordinate system, i.e. to a coordinate system of the position measurement system. The first marker structure is measured in the coordinate system of the position measurement system. The substrate coordinate system (SKS) is aligned via this data. The substrate coordinate system of a mask is also referred to as mask coordinate system. The substrate coordinate system of a mask blank is also referred to as blank coordinate system.

The selection of the second marker structures to be measured and the predetermined intended position data thereof are then predetermined in an alignment data record (AL). This selection of the second marker structures to be measured and the intended position data thereof is a component of a data structure which forms a logical layer, which is also referred to as adjustment or alignment layer. Such an alignment data record with intended position data can be assigned to each substrate.

The transformation is calculated or simulated. In particular, an algorithmic method, in particular an optimization method, serves to determine the transformation. In particular, an iterative method can be provided for determining the transformation.

In accordance with one aspect of the invention, the deviation between the actual position data in the transformed substrate coordinate system and the intended position data in the non-transformed substrate coordinate system is reduced by at least a factor of 2, in particular at least a factor of 3, in particular at least a factor of 5, in particular at least a factor of 10.

Intended positions are predetermined with an accuracy that is smaller, i.e. better, the 1 nm. The deviation between the actual positions and the intended positions lies at at most 4 nm. The measurement accuracy of the position measurement system lies at 0.5 nm. Here, the accuracy is provided, in particular, by the precision and/or reproducibility, in particular the $3\sigma$ uncertainty when determining the position data.

In accordance with one aspect of the invention, the actual position data are established via the same position measurement system as the adjustment marks are measured with for aligning the substrate coordinate system.

In accordance with a further aspect of the invention, the first marker structure and/or the second marker structure has at least two, in particular at least three, in particular at least four, in particular at least five elements to be measured.

This enables a so-called multipoint alignment. In the case of more than three elements, the structure elements are, in particular, not arranged along a common straight line. They are preferably arranged distributed substantially over the whole surface of the substrate.

The accuracy of the definition of the substrate coordinate system and, in particular, the transformation for converting the substrate coordinate system into the predetermined reference system can be improved by a larger number of structure elements to be measured.

In accordance with a further aspect of the invention, an optical method is provided for measuring the at least one first marker structure and/or for determining the actual position data of the second marker structure. In particular, an optical method, in which illumination radiation with a wavelength in the UV, VUV, DUV or EUV range is used, is provided.

The marker structure and/or the second marker structure can, in particular, be measured using illumination radiation with a wavelength of 193 nm. In respect of details, reference is made, once again, to DE 10 2007 033 814 A1 and WO 2008/071268 A1, which are integrated into the present application as a component thereof.

In accordance with a further aspect of the invention, a two-stage, in particular a multistage optical method is provided for measuring the at least one marker structure. Here, in a first step, the arrangement of the at least one first marker structure on the substrate is measured with an image field with a first area (A1) and, in a subsequent step, with an image field with a second area (A2), wherein A2<A1 applies. By way of example, the image field A1 has dimensions of a square with an edge length of 1 mm, while the image field A2 e.g. has dimensions of a square with an edge length of 20 µm. The image field A2 can have a diameter in the range from 10 µm to 100 µm, in particular of less than 50 µm, in particular of less than 30 µm. The dimensions of the image fields are specified in dimensions on the substrate.

In a first step, the arrangement of the at least one marker structure on the substrate can be established using illumination radiation with a first wavelength $\lambda 1$. In the subsequent step, the marker structure is measured using illumination radiation with a second wavelength $\lambda 2$, wherein the second wavelength $\lambda 2$ is shorter than the first wavelength $\lambda 1$.

In particular, the following applies: $\lambda 2{:}\lambda 1{\leq}0.5$, in particular $\lambda 2{:}\lambda 1{\leq}0.3$, in particular $\lambda 2{:}\lambda 1{\leq}0.2$, in particular $\lambda 2{:}\lambda 1{\leq}0.1$.

The arrangement of the first marker structure on the substrate can, in particular, be performed using illumination radiation in the visible wavelength range. The second wavelength lies, in particular, in the UV, VUV, DUV or EUV range. By way of example, the first wavelength is $\lambda 1{=}500$ nm, the second wavelength is, for example, $\lambda 2{=}193$ nm.

The positions are preferably measured at wavelengths which are as short as possible in order to achieve a high resolution and therefore a high accuracy of the measurement.

Here, this need not necessarily be a single wavelength in each case. The illumination radiation can comprise wavelengths from a wavelength range.

Advantageously, provision is made for the accuracy with which the arrangement of the at least one marker structure on the substrate is determined in the first step to be better than the diameter, in particular half of the diameter, of the image field which is available in the subsequent step for measuring the marker structure.

In the first step, the field of view can have a diameter in the region of up to 1 mm, in particular of up to 10 mm, in particular of up to 100 mm. It can advantageously be possible, in particular, to arrange the whole substrate in the field of view during the first step. This makes it easier to establish the arrangement of all markers on the substrate.

In the subsequent step for measuring the marker structure, the field of view can have a diameter in the range from 10 μm to 100 μm, in particular of less than 50 μm, in particular of less than 30 μm.

A multistage method simplifies the automated measurement of the marker structure.

In accordance with a further aspect of the invention, the second marker structure has one or more structure elements. The structure elements can be fiducial markers, scanner alignment marks, structures, to be imaged, of a lithography mask or defects on a substrate for producing a lithography mask.

The second marker structure to be measured, in particular structure elements, can be special, additional test structures. However, it is advantageously also possible to measure the structures to be imaged themselves, i.e. structures in the used region of the lithography mask. In principle, additional test structures can be dispensed with. As a result, valuable space on the substrate can be saved.

In accordance with a further aspect of the invention, the transformation is determined as a selection or combination of a linear transformation, such as e.g. a rigid-body transformation, in particular a translation and/or a rotation and/or a scaling and/or an orthogonal transformation. It is also possible to carry out higher-order transformations.

In accordance with one aspect of the invention, provision is made for selecting the possible types of transformation from a list of transformations. In particular, it is possible to predetermine boundary conditions for the transformation.

The transformation is, in particular, predetermined as a function of the imaging possibilities of a given scanner. In this case, the employed transformation corresponds to the transformation which is performed when imaging the structures on the wafer directly by the corresponding scanner.

This measure is advantageous in that the suitability of the mask for the actual process of wafer exposure can be established with increased accuracy.

In accordance with a further aspect of the invention, the actual position data of the at least one second marker structure in the substrate coordinate system is established in an automated manner.

In accordance with a further aspect of the invention, the at least one second marker structure comprises the at least one first marker structure. In particular, the first marker structure can serve both for aligning the substrate relative to the position measurement system and for establishing the transformation.

When establishing actual position data (IST) of the second marker structure, actual position data (IST) of the at least one first marker structure are also established in the substrate coordinate system (SKS) by way of this measure.

An advantage of this measure is that an application of the method is made possible, even in cases where few marker structures are present. In particular, when measuring EUV mask blanks having four fiducial marks, two marks can serve as first marker structures and all four fiducial marks can be measured as second marker structures.

In accordance with a further aspect of the invention, the first marker structure is embodied as an alignment mark of a used structure of a lithography mask, wherein the second marker structure is embodied as a scanner alignment mark of the mask structure and wherein the substrate coordinate system (SKS) is embodied as mask coordinate system.

This measure enables the measurement of a conventional lithography mask. All marker structures are predetermined in the mask design. When producing the lithography mask, the mask structure is generated on the basis of the mask design on the mask blank.

In accordance with a further aspect of the invention, the method comprises the following step:
   establishing at least one position in the region of the used structure of the lithography mask in the mask coordinate system.

This step comprises the measurement of the mask with a position measurement system in order to establish the position error. Special structure elements, which are referred to as a "registration pattern" or as a "mark", on a mask, such as e.g. squares, crosses or angles with predetermined shapes, can be measured and compared to the intended positions thereof. It is also possible to measure positions of structure elements on the mask, which structure elements are a part of the used structures of the mask.

In accordance with a further aspect of the invention, the method comprises the following steps:
   measuring at least two used structures of two lithography masks,
   establishing the overlay of the at least two used structures.

This measure is advantageous in that the suitability of the masks for the actual process of exposure of a wafer with successive lithography masks can be established with increased accuracy.

In accordance with a further aspect of the invention, the method comprises the following step:
   graphical rendering of the superposition of the at least two used structures.

As a result of the visual rendering, a quick intuitive assessment of the quality of the measured lithography masks is made possible.

In general, provision can be made for an overlay error to be established from the measured actual position data of the used structures, in particular after the transformation of the coordinate system, in particular after a transformation of the actual position data from different lithography masks into a common coordinate system. Here it is possible, in particular, to test whether the overlay satisfies specific, predetermined requirements. In the case of a deviation from these predetermined criteria, a corresponding signal, in particular a graphic and/or acoustic signal, can be generated. This can simplify the decision whether different lithography masks, or which lithography masks, from a predetermined selection are used, or at least can be used, for a multi-exposure of a wafer.

In accordance with a further aspect of the invention, the first marker structure and the second marker structure are embodied as fiducial marks of a mask blank and wherein the substrate coordinate system (SKS) forms a mask blank coordinate system.

This measure enables the measurement of mask blanks, in particular EUV mask blanks.

In accordance with a further aspect of the invention, the positions of the defects, to be measured, of the mask blank are predetermined in a defect data record.

A measurement of the whole area of the substrate using the position measurement system is very time-consuming. Therefore, the defects of a substrate can be established in a preceding step using a faster, but also less precise method. The defects established thus and the positions thereof form the defect data record. These positions can be directly approached and measured, in particular measured more precisely, by the position measurement system.

In accordance with a further aspect of the invention, the method comprises the following step:

measuring the positions of defects of the mask blank using the position measurement system.

Using this measure, the highly precise establishment of defects is made possible. The positions of the defects can be established via the position measurement system, in particular with an accuracy of better than 3 nm, in particular better than 1 nm, in particular better than 0.5 nm.

In accordance with a further aspect of the invention, the actual positions of the measured defects are stored in a substrate map. The substrate map is, in particular, a data record, which is stored in a storage unit of the position measurement system or in an external storage.

In accordance with a further aspect of the invention, a position of the used structure on the mask blank is established such that as many defects of the substrate map as possible are covered by the used structure in such a way that these have no influence, or the smallest possible influence, on the imaging properties of the completed lithography mask when illuminating same using illumination radiation of an intended wavelength.

As a result of the highly accurate specification of the actual positions of the defects, the alignment of the used structure can be more precise than would have been possible on the basis of the original defect data record. As a result, it may be possible to use EUV mask blanks which were unusable without applying this measure.

If it is not possible for all defects of a mask blank to be covered by the absorber, a check is to be carried out as to whether the defects which are not covered, or the defects which are still interfering during the imaging, can be repaired. If this is not the case, the mask blank cannot be used for producing a lithography mask with the used structure that was checked. A check for a different used structure can be carried out.

In particular, provision can be made for predetermining different used structures, i.e. used structures with different designs, and for examining a specific mask blank in respect of whether the above-described alignment of at least one of these used structures is possible on the basis of an established defect data record. If none of the used structures can accordingly be arranged on the mask blank, in particular not even when taking into account possible repairs of interfering defects, the mask blank must be discarded. As a result of this it is possible, firstly, to reduce the number of rejects of unused mask blanks and, secondly, in this manner, to discard an unusable mask blank before producing a faulty lithography mask. This leads to time and costs being saved.

The position data of the used structure can be established by a computer-assisted optimization method.

In accordance with a further aspect of the invention, the method comprises the following step:

graphical rendering of the superposition of the defects of the substrate map and the mask structure or the used structure.

As a result of this measure, a quick visual assessment of the usability of a mask blank for a structure is made possible. In general, provision can be made for defining a parameter which specifies a measure for how well the defects of the mask blank can be covered by a given used structure. In the process, it is possible, in particular, to establish a maximum error and/or an averaged error and/or an error integrated over the whole mask blank. Thereupon it is possible to generate a signal, in particular a visual and/or an acoustic signal, as a function of this parameter value or these parameter values. From this signal, a user can easily assess and identify whether, and in particular how well, the defects of a given mask blank are coverable by a specific used structure.

A further object of the invention consists of providing a position measurement system for carrying out the method in accordance with the preceding description.

This object is achieved by features of a position measurement system disclosed herein. The advantages emerge from those described for the method.

Preferably, the position measurement system renders it possible to measure the marker structure with illumination radiation in the visible range and with illumination radiation in the UV, VUV, DUV or EUV range.

In particular, illumination radiation in the UV, VUV, DUV or EUV range is provided for establishing the actual position data in the substrate coordinate system with the greatest measurement accuracy.

A further application of the invention consists of improving a method for producing a microstructured or nanostructured component.

In particular, it is possible via the method according to the invention to arrange a lithography mask very precisely in the projection exposure apparatus, in particular in the object field of same. It can therefore be imaged very precisely on the wafer.

The increased precision of the arrangement of the lithography mask in the beam path of the projection exposure apparatus renders it possible to improve the precision of the structures on the wafer.

For the purposes of precisely arranging the lithography mask, the substrate embodied as a lithography mask is initially measured according to the method in accordance with the preceding description. Thereupon, the substrate is arranged and/or aligned in an object field of the projection exposure apparatus as a function of the established position of the marker structure and/or the actual position data of the second marker structure.

As a result of the reference to the precisely measured structures, the precision of the arrangement of the lithography mask can be substantially improved. In particular, the lithography mask is arranged in the object field of the projection exposure apparatus with a precision of better than 100 nm, in particular better than 50 nm, in particular better than 30 nm, in particular better than 20 nm, in particular better than 10 nm, in particular better than 5 nm, in particular better than 3 nm, in particular better than 2 nm, in particular better than 1 nm. In particular, the lithography mask is arranged in such a way that the structures to be imaged are arranged with such a precision in the beam path of the projection exposure apparatus.

The projection exposure apparatus is, in particular, one for DUV or EUV lithography. In these, the highly precise arrangement of the lithography mask, in particular with a precision in the nanometer range or sub-nanometer range, is particularly important.

In the production of semiconductors, provision is made for exposing the wafer at least twice, in particular a number of times, in particular at least three times, in particular at least five times, in particular at least eight times, in particular at least twelve times, in particular at least twenty times, in particular at least thirty times, in particular at least forty times, in particular at least fifty times. Here, a different lithography mask can in each case be provided for each exposure. It is also possible to use the same lithography mask a number of times.

The superposition of a plurality of structures on the wafer is also referred to as overlaying or multiple patterning, in particular double patterning. In particular, provision can be made for exposing the wafer a number of times, in particular two times or more, between two successive etching steps. As a result of this, the structure density of the structures on the wafer, in particular of the structures in a single layer on the wafer, can be increased. A highly precise arrangement of the lithography masks in accordance with the preceding description is an essential precondition for such an overlay. Here, a precision in the nanometer/sub-nanometer range is required, especially in the DUV and/or EUV range.

In accordance with one aspect of the invention, the transformation of the substrate coordinate system is selected in accordance with a correction which can be carried out via the projection exposure apparatus when imaging the object field into the image field.

Using this, it is possible to predict and/or simulate the behavior of a scanner. In particular, it is possible to predict, in particular simulate, whether, or how well, a given selection of lithography masks with specific used structures can be used by a predetermined scan for multiple exposure, in particular for overlay and/or multiple patterning, in particular double patterning.

A further object of the invention consists of improving a method for producing a lithography mask.

This object is achieved by a method in which, initially, the actual positions of the defects, which are always present on a substrate for producing a lithography mask, are established very precisely in accordance with the method described above and, thereupon, a structure for the lithography mask to be imaged is selected and/or arranged on the substrate, wherein the structure to be imaged is selected and/or arranged on the substrate as a function of the actual positions of the defects.

The arrangement of the structure of the lithography mask to be imaged relative to the defects on the substrate, which serves to produce the lithography mask and which is also referred to as a mask blank, has a decisive influence on the effect of the defects on the properties of the completed mask. In particular, it is possible to select the structure to be imaged and/or arrange the latter on the substrate in such a way that at least some of the defects, preferably all of the defects, are covered by the structure in such a way that they have no influence on the imaging properties of the completed lithography mask when illuminating same with illumination radiation with the provided wavelength.

In order to be able to adapt the selection and/or arrangement of the structure to be imaged to the defects to the best possible extent, knowledge about the precise location and the precise dimensions of the defects is essential. Although the defects and the positions thereof on the mask blank are usually provided by the mask blank producer as an alignment data record, the data record however usually only has an accuracy of approximately 100 nm. It was recognized that the method described above can advantageously be used for measuring the defects in a highly precise manner. As a result of this, the method for producing the lithography mask is substantially improved.

Figure 2:
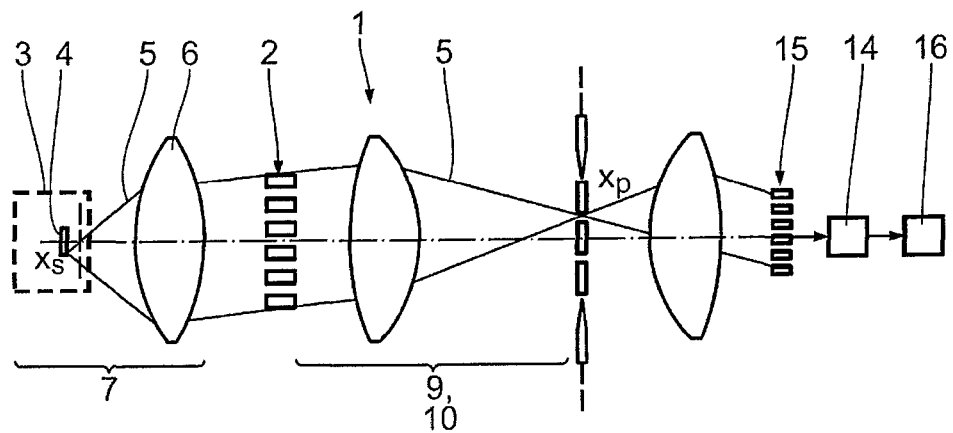
Figure 3:
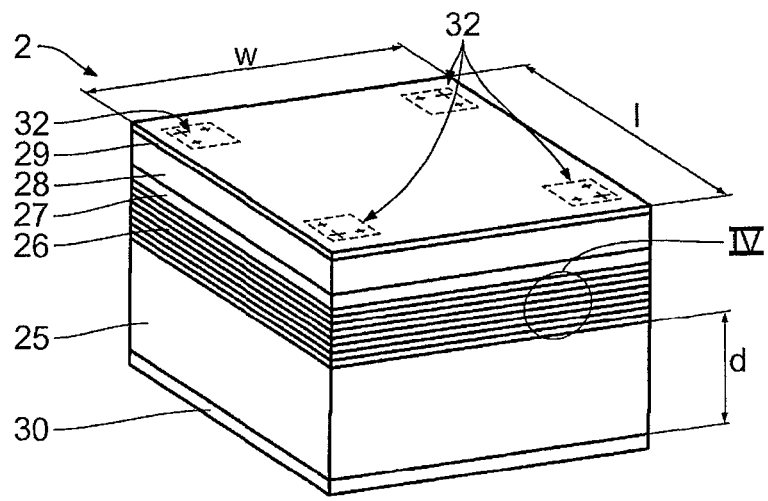
Figure 4:
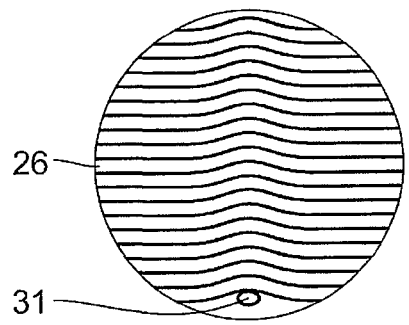
Figure 5:
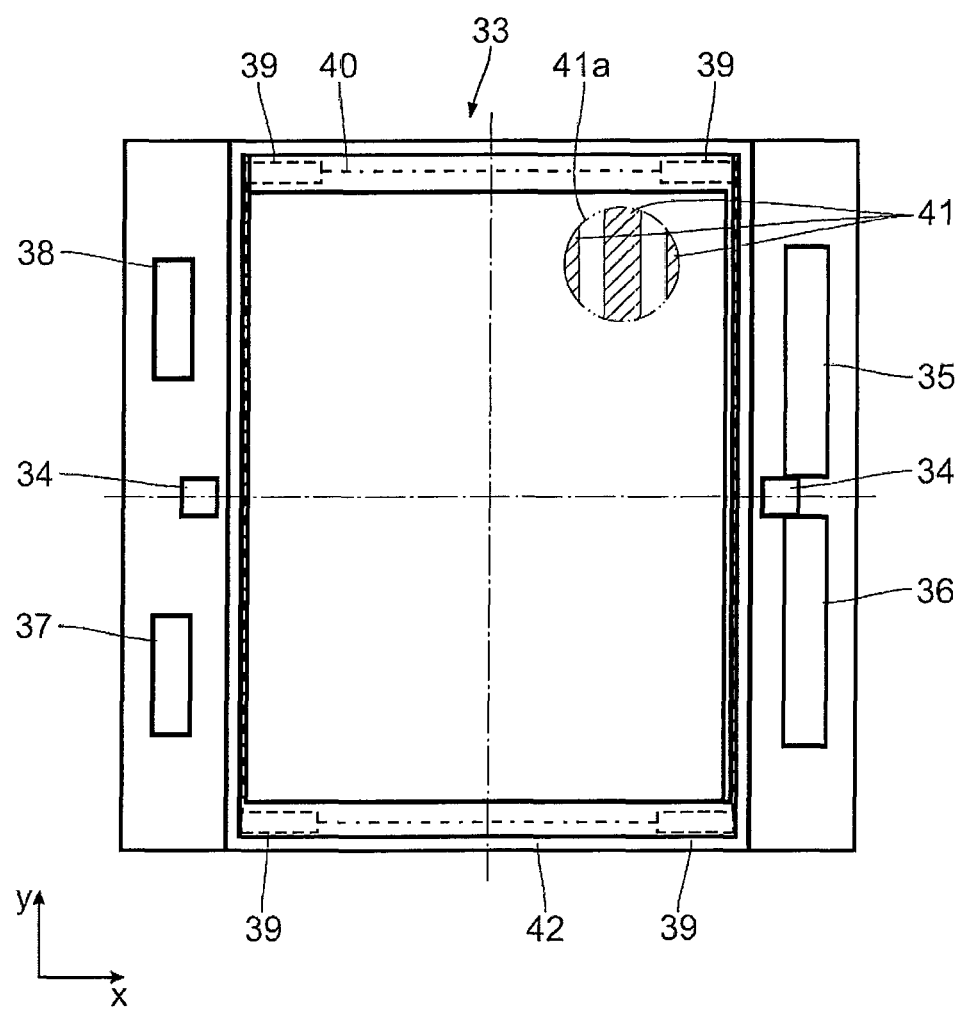
Figure 6:
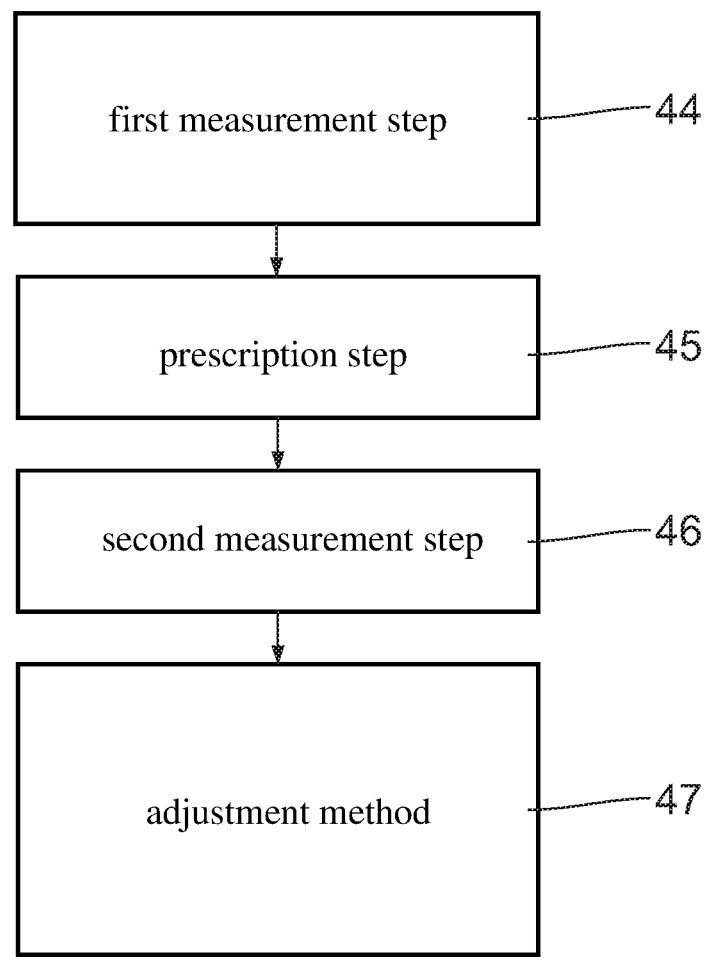
Figure 7:
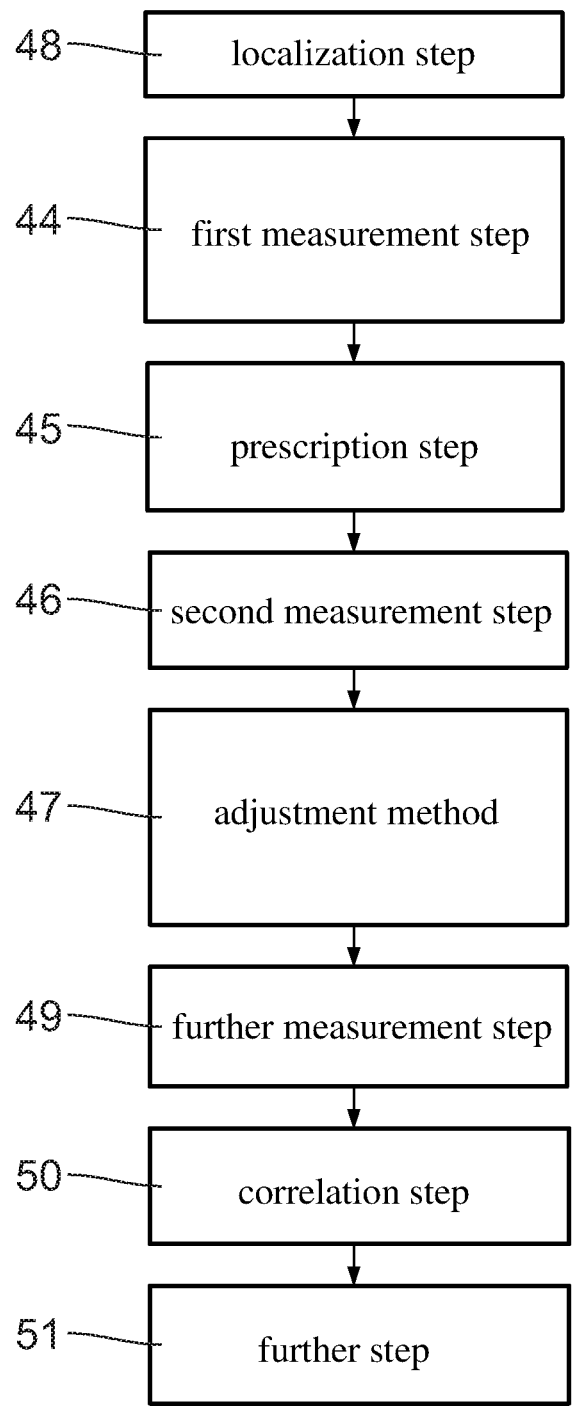

Further details and particulars of the invention and advantages of same emerge from the following description of exemplary embodiments on the basis of the figures. In detail:

FIG. 1 schematically shows the setup of a position measurement system for inspecting substrates, FIG. 2 schematically shows the beam path in a position measurement system for inspecting substrates, FIG. 3 schematically shows the basic setup of a substrate for an EUV mask, FIG. 4 shows a sectional magnification of the region IV of the cross section of the substrate in accordance with FIG. 3, FIG. 5 shows a schematic image of the structure of a lithography mask, FIG. 6 schematically shows the general course of a method for measuring a lithography mask, and FIG. 7 schematically shows the general course of a method for measuring a mask blank for producing a lithography mask.

In the following, the general setup of a position measurement system 1 for inspecting substrates, in particular for measuring substrates, in particular for measuring structures of lithography masks and/or localizing and/or measuring defects on substrates 2, in particular on substrates for producing lithography masks, in particular DUV or EUV masks is initially described with reference to FIG. 1. The position measurement system 1 is also referred to as "prove tool". In respect of the general setup of the position measurement system 1, reference is also made to DE 10 2007 033 814 A1, WO 2008/071268 A1 and G. Klose et al., "High-resolution and high-precision pattern placement metrology for the 45 nm node and beyond" (EMLC 2008). Herewith, these three documents are integrated into the present application as a component thereof.

The position measurement system 1 comprises an illumination device 3. In FIG. 1, two illumination devices 3 are depicted, with the upper illumination device 3 serving for illuminating the substrate 2 in the reflection mode. The lower illumination device 3 serves to illuminate the substrate 2 in the transmission mode. The position measurement system 1 comprises at least one of these two illumination devices 3. It can also comprise both illumination devices 3. As a result of this, the flexibility of the position measurement system 1 can be increased. Two different illumination devices 3 render it possible to use the position measurement system 1 for measuring the substrates in transmission or reflection.

The illumination device 3 comprises a radiation source 4. The radiation source 4 can, in particular, be a laser, in particular an ArF laser. The radiation source 4 serves to generate illumination radiation 5. The illumination radiation 5 has a wavelength of 193 nm.

Alternative radiation sources 4, which generate illumination radiation 5 with different wavelengths or in a different wavelength range, are likewise possible.

The illumination device 3 can be a component of an illumination system 7 with further optical components. The illumination system 7 can, in particular, have lens elements 6 and/or mirrors and/or filters and/or stops.

FIG. 2 schematically depicts the beam path of the illumination radiation 5 in the position measurement system 1. The lens element 6 depicted in FIG. 2 should be understood to be exemplary. This component can also be a plurality of lens elements and/or one or more mirrors.

Moreover, the position measurement system 1 comprises imaging optics 9. The imaging optics 9 have an object-side numerical aperture of 0.8. The imaging optics 9 are also referred to as projection optics.

Magnification optics 10 are arranged in the beam path downstream of the imaging optics 9.

The imaging optics 9 and the magnification optics 10 can be components of phase contrast optics.

The overall magnification of the imaging optics 9 and of the magnification optics 10 is 265:1. A different imaging scale is likewise possible.

The position measurement system 1 furthermore comprises a sensor device. The sensor device is, in particular, embodied as a camera, in particular as a CCD camera 14. An image 15 of the substrate 2 to be examined is recordable via the CCD camera 14. In particular, an image stack of the substrate 2 with at least two images with different defocus is recordable via the CCD camera 14. The image field of the substrate to be imaged, which is imaged on the sensor device, has the dimensions of a square with an edge length of 20 µm, as measured on the substrate.

The CCD camera 14 is connected to an image processing device 16 in a data-transmitting manner.

Moreover, the position measurement system 1 comprises a holding system 17. The holding system 17 (also referred to as stage, object table or displacement unit) serves to position the substrate 2 in the beam path of the inspection system 1. The holding system 17 is actively controllable. It is in particular precisely displaceable. It has six degrees of displacement freedom. In particular, an interferometer device 18 is provided for determining the location and/or alignment of the holding system 17.

Moreover, the position measurement system 1 comprises auxiliary optics 21. The auxiliary optics 21 are connected to a control device 22 for controlling the displacement of the holding system 17 in a data-transmitting manner. The image field of the substrate of the auxiliary optics 21 to be imaged on the sensor device has the dimensions of a square with an edge length of 1 mm, as measured on the substrate. The substrate 2 can be roughly aligned via the auxiliary optics 21.

Moreover, the position measurement system 1 comprises an autofocus system 23. Moreover, one or more beam splitters 24 can be provided in the beam path with the position measurement system 1.

Moreover, the position measurement system 1 can have an interferometer unit, in particular in the form of an etalon, which is not depicted in the figures. The etalon serves to monitor the wavelength of the illumination radiation 5. With the aid of the etalon it is possible to correct changes in the wavelength, which may occur e.g. on account of pressure, temperature or moisture variations.

In order to measure the position of a structure or defect, an aerial image of a portion of a lithography mask or of a substrate is recorded via the position measurement system. Here, the lithography mask or the mask blank lies on the holding system, which permits a displacement of the mask in the direction of the mask plane, in order to enable the positioning of a desired portion in the image field of the position measurement system for the purposes of recording the image using the detector. The holding system is aligned in the machine coordinate system of the position measurement system 1. The position is established and the substrate is aligned with the aid of the at least one first marker structure. Here, two alignment marks are present in the case of conventional lithography masks. In the case of mask blanks, two of four fiducial marks are used. The substrate coordinate system (SKS) is aligned with the aid of the positions of the first marker structure in the machine coordinate system. For the purposes of measuring an actual position of a structure, in particular a used structure 41, the lithography mask is displaced by the holding system in such a way that the intended position of the structure to be measured lies in the image field, in particular at the center point of the image field, of the position measurement system. Then, an aerial image of the structure is recorded by the detector. A deviation between the actual position and the intended position is established by evaluating the aerial image.

It is initially impossible to establish the position if the deviation between the actual position and the intended position is so great that the structure to be measured does not come to rest within the image field of the position measurement system when positioning the lithography mask or the mask blank.

In a first alternative, the structure to be measured is searched for by moving the substrate. Here, the image field of the intended position is initially circumnavigated, with aerial images being recorded of all parts of the region. Then, the previously searched region is circumnavigated. This is continued until the structure is found. This method is also referred to as a spiral search. The method can occur automatically in a manner controlled by the image processing device 16 if the structure to be measured is predetermined.

In a second alternative, the structure to be measured is searched for with the aid of the auxiliary optics 21. In the case of an initially unchanged position of the substrate, a larger region of the substrate is imaged on the sensor unit via the auxiliary optics 21. The substrate is aligned by displacing the holding system in such a way that the structure to be measured comes to rest in the center of the image field.

Below, a first alternative for the substrate 2 to be examined is described in more detail with reference to FIGS. 3 and 4. The substrate 2 depicted in FIG. 3 is a substrate 2 for producing a lithography mask, in particular for EUV lithography.

The substrate 2 comprises a base substrate 25. The base substrate 25 is made of a material with a low coefficient of thermal expansion (LTEM material; low thermal expansion material substrate). Here, in particular, this can be quartz or a so-called ULE glass (ultra low expansion glass). The substrate has a length l and a width w. By way of example, the length l and the width w are 152 mm. Other dimensions of the substrate 2 are likewise possible. The base substrate 25 has a thickness d. The thickness d of the substrate 2 can be 6.35 mm. Other thicknesses are likewise possible.

A multilayer 26 is applied to the base substrate 25. The multilayer 26 comprises a sequence of at least 10, in particular 20, in particular 30, in particular 40, in particular 50 silicon/molybdenum bilayers. The number of silicon/molybdenum bilayers is, in particular, less than 200, in particular less than 100. In particular, it can be less than 80, in particular less than 70, in particular less than 60. Here, each bilayer has a silicon layer with a strength of 4.1 nm and a molybdenum layer with a strength of 2.8 nm. The multilayer 26 serves, in particular, to reflect EUV radiation. A capping layer 27 is applied to the multilayer 26. The capping layer 27 can be made of ruthenium. It has a thickness of 2.5 nm.

An absorber layer 28 is applied to the capping layer 27. In particular, the absorber layer 28 can have materials with a component of a tantalum nitride compound, in particular tantalum nitride, tantalum boron nitride or tantalum silicon nitride.

The absorber layer 28 has a thickness in the range from 44 to 108 nm.

An antireflective coating 29 (ARC) is applied to the absorber layer 28. The antireflection layer 29 can consist of the same base material as the absorber layer 28. There usually is an oxygen gradient between the absorber layer 28 and the antireflection layer 29 such that the oxygen component of the antireflection layer 29 is higher than that of the absorber layer 28. In particular, the antireflection layer 29 can have a component of tantalum oxynitride.

Finally, a rear side layer 30 is applied to the rear side of the base substrate 25, i.e. to the side of the base substrate 25 opposite to the multilayer 26. The rear side layer 30 is made of an electrically conductive material. In particular, this can be a coating made of chromium. The rear side layer 30 has a thickness in the range from 20 to 200 nm.

The totality of the layers 25 to 30 is also referred to as a mask blank, in particular as an EUV blank. The mask blank forms the substrate 2 for producing an EUV mask.

It was determined that, in particular, the boundary layer between the base substrate 25 and the multilayer 26 is decisive for the quality of the EUV mask produced from the substrate 2. It is assumed that more than 90% of defects 31 of the subsequent EUV masks originate from this boundary layer. Such defects 31 can lead to the lithography mask produced from the substrate 2 no longer being used for structuring a wafer.

Furthermore, it was determined that the defects 31 on the surface of the base substrate 25 are covered when the multilayer 26 is deposited. However, they are visible as a phase defect. They are visible as a phase defect, in particular when irradiating the mask with EUV radiation, in particular in the reflected portion of the EUV radiation.

For elucidation purposes, FIG. 4 depicts how one of the defects 31 leads to a so-called bump defect, i.e. an elevation, in the multilayer 26. The defect can also lead to a depression in the multilayer 26. In this case, it is also referred to as a pit defect. In general, a defect 31 leads to a deviation of the surface of the base substrate and/or the multilayer 26 from a perfect planar embodiment.

The defects 31 can be very flat. They can have a height of less than 1 nm. In particular, the height of the defects 31 lies in the range from 0.5 nm to 10 nm.

According to the invention, it was identified that a critical defect 31, i.e. a defect 31 which is large enough to possibly have a disadvantageous effect on the structuring of a wafer, must firstly be identified and secondly be repaired or compensated for.

For defects 31 which occur at the boundary between the base substrate 25 and the multilayer 26, or which occur within the multilayer 26, conventional strategies, which machine the surface of the substrate 2, are not suitable for repair or compensation purposes. According to the invention, provision is made for hiding such defects 31 under the absorber layer 28. To this end, provision is made to select and/or align the structure via which the substrate 2 is intended to be structured in such a way that the defects 31 on the substrate 2 are covered by the absorber layer 28, even after application of the structure.

To this end, it is necessary to establish the precise position of the defects 31 on the substrate 2 and the dimensions thereof.

According to the invention, provision is made for establishing the position of the defects 31 on the substrate 2 via a measurement with the position measurement system 1, in particular relative to measurement marks 32 (fiducial marks), which are applied to the substrate 2, in particular in a standardized manner, in particular in accordance with the SEMI-P48 standard.

Measuring the whole area of substrates using the position measurement system 1 is very time-consuming. Therefore, the defects 31 of a substrate 2 are established in a preceding step with a faster, but also less accurate method. By way of example, the defects 31 are measured using a so-called ABI tool (actinic full-field mask blank inspection tool). Such a system was developed by MIRAI-Semiconductor Leading Edge Technologies. Details in respect of the method and the instrument are disclosed, for example, in the publications: "Fiducial Mark requirements from the viewpoints of Actinic Blank Inspection tool for phase defect mitigation on EUVL Mask", Proc SPIE volume 8522 and "Actinic Mask Blank Inspection and Signal Analysis for Detecting Phase Defects Down to 1.5 nm in Height", Japanese Journal of Applied Physics 48, 2009.

The positions of defects measured thus are provided in a defect data record. An accurate measurement using the position measurement system 1 then takes place at the positions which are predetermined in the defect data record.

If the positions of all defects 31 of a substrate 2 are known, it is possible to generate a substrate map including these positions. Subsequently, the mask design can be adapted to this map, in particular by a linear displacement and/or a rotation of the design, in such a way that at least a portion of the defects 31 are covered by the absorber layer 28. In particular, it is possible to adapt the mask design in such a way that at least 50%, in particular at least 70%, in particular at least 80%, in particular at least 90%, in particular at least 95%, in particular at least 99%, in particular all, of the critical defects 31 are covered by the absorber layer 28. In particular, the defects 31 are covered by the absorber layer 28 to at least such an extent that they no longer have a disadvantageous effect on the structuring of a wafer. If this should not be possible, the substrate 2 can be dispensed with.

In the following, the general structure of a lithography mask 33 is described with reference to FIG. 5. The lithography mask 33 can, in particular, be a DUV mask or EUV mask. The lithography mask 33 can have a transmissive or reflective embodiment.

The lithography mask 33 comprises the structure described for the mask blank, in particular the base substrate 25 with the multilayer 26 and further layers 27 to 30.

First adjustment markers 34 are arranged on the lithography mask 33. The markers are also referred to as alignment marks. In general, these are part of a first marker structure or form the latter.

The first adjustment markers 34 are arranged at predetermined positions on the lithography mask 33. The positions of the first adjustment markers 34 are predetermined, in particular, with an accuracy in the range of 1 µm to 100 µm, in particular with an accuracy of the order of 10 µm. In particular, these are predetermined with an accuracy such that these can be reliably arranged in the image field of the position measurement system 1 for the first measuring step 44. By way of example, the image field of the position measurement system 1 has dimensions of 25 µm×25 µm.

If the arrangement of the first adjustment markers 34 is not known a priori, it can initially be established with the aid of the auxiliary optics 21. In particular, the position of the first adjustment markers 34 can be established using illumination radiation in the visible range. To this end, use can be made of an automated search method. The auxiliary optics 21 can be adjusted in such a way that the adjustment markers 34 also reliably lie in the image field of the position measurement system 1 in the case of a centered arrangement in the image field of the auxiliary optics 21.

The aforementioned spiral search can also serve to establish the position of the adjustment markers 34.

In particular, the lithography mask 33 has two first adjustment markers 34. It can also have more than two, in particular at least three, in particular at least four, first adjustment markers 34.

Different regions 35, 36, 37, 38 with further markers can be provided on the lithography mask 33. The markers can be machine-readable markers or markers which are readable, in particular visually readable, by the user of the lithography mask 33.

Moreover, second adjustment markers 39 are arranged on the lithography mask 33. Four second adjustment markers 39 are provided in the lithography mask 33 depicted in FIG. 5. In particular, they are arranged in such a way that they span a rectangular region 40, in which a used structure 41 of the lithography mask 33 is arranged. In FIG. 5, the used structure 41 is only depicted in sections in a region 41a. In particular, it is not depicted true to scale in FIG. 5.

In particular, the second adjustment markers 39 can be markers for aligning the scanner, so called scanner alignment marks.

In particular, the second markers 39 can also comprise a plurality of markers which, in particular, are arranged on the lithography mask 33 in a predetermined pattern, in particular in a grid, in particular in a two-dimensional grid, in particular in a two-dimensional regular grid, i.e. in a two-dimensional grid with a constant, identical distance between adjacent markers. In particular, these markers can be arranged on the lithography mask in a Cartesian grid, i.e. in lines and columns extending perpendicular to one another. They can also be arranged in a triangular or hexagonal grid on the lithography mask 33.

A plurality of the second adjustment markers 39 can advantageously be used in the determination of the transformation T, in particular for determining higher-order corrections.

A region 42 for arranging and/or fastening a pellicle is provided around the region 40 with the used structure 41.

Below, a method for measuring and/or aligning the lithography mask 33 is described with reference to FIG. 6.

Initially, two or more of the first adjustment markers 34 are measured in a first measurement step 44. In particular, the marker structure is measured in the first measurement step 44. The first adjustment markers 34 are measured in a machine coordinate system of the position measurement system 1. The first measurement step 44 serves, in particular, to align a substrate coordinate system SKS provided by the adjustment system. The first measurement step 44 is therefore also referred to as alignment or adjustment step. In particular, the substrate coordinate system SKS is aligned, i.e. adjusted, relative to the coordinate system of the position measurement system 1 in the first measurement step 44. This subsequently renders it possible to measure positions in the substrate coordinate system SKS very precisely with the aid of the position measurement system 1.

The alignment data record AL with intended position data POS of a second marker structure is provided in a provision or prescription step 45. The second marker structure can comprise the second adjustment markers 39 and/or the used structure 41.

The alignment data record is also referred to as alignment layer (AL). Here, this is a logical layer, in which the intended position data of the second marker structure are predetermined. Any markers, generally structures or partial structures, and the intended positions thereof can be predetermined in the alignment layer. In particular, the intended positions are predetermined in the substrate coordinate system SKS as a reference system.

The actual position data IST of the second marker structure is established in the substrate coordinate system SKS in a second measurement step 46. The position measurement system 1 in particular serves to establish the actual position data IST. In particular, the first measurement step 44 and the second measurement step 46 can be performed in the same position measurement system 1.

The actual position data IST are determined with an accuracy that is better than 100 nm, in particular better than 10 nm, in particular better than 1 nm. This is more precise than the accuracy of the intended position data by at least a factor of 2, in particular at least a factor of 5, in particular at least a factor of 10.

According to the invention, what was discovered is that the actual position data IST often do not, or at least not completely, correspond with the intended position data POS. By way of example, this can be traced back to inaccuracies when determining the intended position data POS, a drift of the substrate in the position measurement system 1, a deformation of the substrate, in particular due to thermal effects or other factors.

In order to reduce deviations between the actual position data IST and the intended position data POS, provision is made for an adjustment method 47. A transformation T for converting the substrate coordinate system SKS into a transformed substrate coordinate system tSKS is established in the adjustment method 47. In particular, a so-called multi-point alignment serves to this end.

The transformation T is, in particular, a rigid body transformation, in particular a translation and/or rotation.

In particular, provision is made for transforming the substrate coordinate system SKS. The substrate coordinate system SKS is, in particular, transformed in such a way that there is the best possible correspondence between the actual position data IST in the transformed substrate coordinate system tSKS and the intended position data POS in the predetermined reference system, namely the substrate coordinate system SKS.

The transformation T is established, in particular, by algorithm, particularly in a computer-aided manner. In order to determine the transformation T, provision can be made, in particular, for an iterative method or correlation method. The transformation T can also be simulated.

In particular, the transformation T is established in such a way that the deviations between the actual position data IST and the intended position data POS are reduced. Here it is possible, in particular, to define a parameter which quantifies the deviations between the actual position data IST and the intended position data POS. In particular, the maximum deviation between the actual position data IST and the intended position data POS and/or the mean deviation and/or a sum of all deviations can be included in this parameter.

When the transformation T is established, it is possible to predetermine as a boundary condition that this parameter is at least reduced to a predetermined, maximum admissible value. Should this not be possible, provision can be made for generating an appropriate signal, in particular a visual and/or acoustic signal.

Provision can also be made for minimizing this parameter.

In accordance with an advantageous embodiment, the transformation T can additionally comprise higher-order corrections in addition to a portion of a rigid-body transformation. In particular, the transformation T can comprise a portion of a scaling and/or an orthogonal transformation. A higher-order transformation can also be comprised.

In particular, the transformation T can comprise a component which corresponds to corrections which can be undertaken by a given projection exposure apparatus when exposing a wafer, in particular when imaging a reticle in the object field onto a wafer in the image field.

Below, a method for measuring a substrate in the form of a mask blank 2 for producing a lithography mask is described with reference to FIG. 7. In terms of essential method steps, the method corresponds to the method depicted in FIG. 6, with reference to the description thereof being made herewith. Corresponding method steps are denoted by the same reference signs as in the method described above.

In the case of measuring a mask blank 2, it is initially necessary to localize the measurement marks 32—the fiducial marks—on the mask blank 2. To this end, a localization step 48 is provided. The measurement marks 32 are usually arranged on the mask blank 2 with an accuracy in the range from 50 µm to 500 µm. The auxiliary optics 21, which, in particular, operates using illumination radiation in the visible range, can serve to localize the measurement marks 32.

In the first measurement step 44, the measurement marks 32 (fiducial marks) are measured in the case of the mask blank 2. Here, the measurement marks 32 serve as first adjustment marks 34, in particular as a first marker structure 34. In particular, provision is made for using two of the measurement marks 32 as first adjustment marks 34, in particular as first marker structure 34.

Thereupon, as in the method described above, the reference coordinate system SKS is defined as a function of the reference data BEZ established from the measurement marks 32.

An alignment data record (alignment layer, AL) with intended position data POS is once again predetermined in the prescription step 45. In particular, the intended position data POS of the further two measurement marks 32 are predetermined.

In principle, it is also possible for the intended position data of the already measured first two measurement marks 32 to be predetermined. This can, in particular, once again serve to determine and/or correct a possible displacement (drift) or deformation of the mask blank 2.

In the second measurement step 46, the actual position data IST of the measurement marks 32, the intended position data POS of which are predetermined in the alignment data record, are measured in the substrate coordinate system SKS.

Thereupon, the transformation T for converting the substrate coordinate system SKS into the transformed coordinate system tSKS is once again established in the adjustment method 47. This is brought about in a manner corresponding to the method described above.

Moreover, the positions of the defects 31 can be established in the transformed substrate coordinate system tSKS in a further measurement step 49. In principle, the further measurement step 49 can be carried out together with the second measurement step 46.

The positions of the defects 31 are only known with little accuracy or only with a large uncertainty prior to the further measurement step 49. In the measurement step 49, the positions of individual defects 31, in particular of all defects, are measured with an accuracy of better than 100 nm, in particular better than 50 nm, in particular better than 30 nm, in particular better than 20 nm, in particular better than 10 nm, in particular better than 5 nm, in particular better than 3 nm, in particular better than 2 nm, in particular better than 1 nm, in particular better than 0.5 nm.

As a result of the positions of the defects 31 then known in more detail, it is possible to more accurately predict which ones of the defects 31 can be hidden under a predetermined used structure 41.

In accordance with one aspect of the invention, provision is made, in particular, for the used structure 41 to be applied to the mask blank 2 to be selected and/or be arranged on the mask blank 2 as a function of the actual position data IST of the defects 31 established with high accuracy.

The selection and/or optimized arrangement of the used structure 41 on the mask blank 2 as a function of the actual position data of the defects 31 can take place in particular in a computer-aided manner, in particular automatically.

Here it is also possible to subject the used structure 41 to a transformation before the application on the mask blank 2. In particular, the transformation can be selected as a function of the transformation T determined by the adjustment method 47.

It is possible for the used structure 41 itself to define a coordinate system or to be defined in a specific, predetermined coordinate system. In this case, a correlation between the substrate coordinate system SKS and the coordinate system associated with the used structure 41 can be established in a correlation step 50. Subsequently, the coordinates of the defects 31 can be established in the coordinate system of the used structure 41 in a further step 51. This is helpful, in particular, to predict which ones of the defects 31 can be hidden under the used structure 41. Since the corresponding defects 31 possibly need not be repaired, the production of the lithography mask can be simplified hereby. Via a suitable selection and/or arrangement of the used structure 41 on the mask blank 2, it is possible, in particular, also to prevent this mask blank 2 or the lithography mask produced therefrom from having to be discarded. Therefore, the yield in the production of lithography masks can be improved by the method according to the invention.

Further aspects of the invention are outlined below.

The precise measurement and/or alignment of the lithography mask or the mask blank 2 is essential, particularly in view of the multiple exposure of a wafer. A multiple exposure of the wafer is made possible as a result of the precision of the actual position data IST in the substrate coordinate system SKS achieved in the second measurement step 46. In respect to the required overlay specifications, reference is made to G. Klose et al., "High-resolution and high-precision pattern placement metrology for the 45 nm node and beyond" (EMLC 2008). The wafer can be exposed a number of times. Here, different lithography masks can be used in each case. It is also possible to use one or more of the lithography masks a number of times. The precision of the knowledge of the actual position data IST of the used structure 41 plays a central role, particularly in the case of multiple use of one and the same lithography mask.

In particular, it is possible to expose the wafer a number of times, in particular two times or more, between two successive etching steps. This is also referred to as multiple patterning, in particular as double patterning. As a result of this, the structure density on the wafer, in particular the structure density within a single layer on the wafer, can be increased.

The first measurement step 44 can be carried out in an automated manner. In particular, it enables the automatic measurement of the marker structure, which is embodied as a first adjustment marker 34. The substrate coordinate system SKS can be aligned more precisely by a greater number of first adjustment markers 34. The second measurement step 46 can be carried out in an automated manner. It enables, in particular, the automatic measurement of the second adjustment markers 39. Determining the transformation T is improved and/or simplified by a greater number of second adjustment markers 39.

The precise knowledge of the position data of the defects 31 on the mask blank 2 is an essential precondition for being able, as a function of the defects 31, to select the used structure 41 to be applied to the mask blank 2 in an optimized manner and/or to arrange the latter on the mask blank 2. This is particularly advantageous if the defects 31 are multilayer defects, which are also referred to as phase defects and which cannot be, in particular cannot be easily, compensated or corrected.

Until now, the positions of the fiducial marks, serving as measurement marks 32, on the mask blanks 2 for producing lithography masks, in particular for producing DUV or EUV lithography masks, have not been known well enough to meet these requirements. The required accuracy and/or reproducibility and/or uncertainty ($3\sigma$) are achieved by the measurement according to the invention of the fiducial marks serving as first adjustment marks 34 and the alignment of the substrate coordinate system SKS made possible as a result.

The method according to the invention enables the automatic measurement of the adjustment markers 34. This is also referred to as second-level alignment. The method furthermore enables an automatic conversion of the measured positions into the substrate coordinate system SKS, which is defined by the first adjustment markers 34 in the second-level alignment. As a result of this, the contributions of the mask, in particular the contributions of the used structure 41, to the overlay error can be determined in an automatic and precise manner. In particular, the contributions of the mask, in particular the contributions of the used structure 41, to the overlay error can be simulated. As a result, it is possible, in particular, to determine whether a lithography mask, or which lithography masks, can be used for exposing the wafer prior to the actual exposure thereof.

The automatic measurement of the alignment marks or the fiducial marks in the position measurement system 1 enables the automatic alignment and/or adjustment of the substrate coordinate system SKS relative to the machine coordinate system of the position measurement system. All further steps of the mask production, in particular treatment and/or compensation of the defects 31, can be performed in the substrate coordinate system SKS as a reference coordinate system.

All measurements of the markers 34, 39 or the defects 31 or the used structure 41 can be brought about in an automated manner via the position measurement system 1. In particular, these can be brought about with an accuracy of better than 100 nm, in particular better than 50 nm, in particular better than 30 nm, in particular better than 20 nm, in particular better than 10 nm, in particular better than 5 nm, in particular better than 3 nm, in particular better than 2 nm, in particular better than 1 nm, in particular better than 0.5 nm.

Moreover, there can be an automatic transformation of the substrate coordinate system SKS. In particular, this can be performed in a computer-aided manner. The transformation of the substrate coordinate system SKS renders it possible to make the overlay error directly visible in the case of an overlay of different lithography masks.

The structure of the alignment data record (alignment layer, AL) can be standardized. In particular, it can be standardized for a specific type of lithography mask and/or for a specific projection exposure apparatus. In particular, provision can be made for the alignment layer to be standardized for each lithography mask which is produced for a specific projection exposure apparatus. This renders it possible to copy the alignment layer. This, firstly, improves the arrangement and/or alignment of the lithography masks in the projection exposure apparatus and, secondly, can reduce the computational complexity for establishing the best positioning of the lithography masks.

The method according to the invention can be used, in particular, for improving a method for producing a microstructured or nanostructured component and for improving a method for producing a lithography mask. The advantages emerge from the more precise imaging of the used structures 41 of the lithography mask 33 on the wafer or from the more precise arrangement of the used structures 41 on the mask blank 2. As a result of the latter, it becomes possible, in particular, to cover defects 31 on the mask blank 2 with unused regions, in particular an absorber layer, in a targeted manner such that the defects do not have a disadvantageous influence on the imaging properties of the completed lithography mask 33 when imaging same with illumination radiation 5 of the provided wavelength.

The invention claimed is:

1. A method of measuring a substrate comprising first and second marker structures, the first marker structure predetermining a substrate coordinate system, the method comprising:
using a position measurement system to align a position of the first marker structure to align the substrate coordinate system relative to the position measurement system; predetermining an alignment data record with intended position data of the second marker structure, the intended position data being relative to the substrate coordinate system;
using the position measurement system to measure actual position data of the second marker structure in the substrate coordinate system; and
establishing a transformation of the substrate coordinate system into a transformed substrate coordinate system to reduce deviations between the actual position data of the second marker structure and the intended position data of the second marker structure, wherein the substrate comprises an object selected from the group consisting of a lithography mask and a lithography mask blank.

2. The method of claim 1, comprising measuring two elements of the first marker structure.

3. The method of claim 2, comprising measuring two elements of the second marker structure.

4. The method of claim 1, comprising measuring two elements of the second marker structure.

5. The method of claim 1, comprising using an optical method to measure the first marker structure, wherein the optical method comprises using illumination radiation with a wavelength selected from the group consisting of the UV range, the VUV range, the DUV range, and the EUV range.

6. The method of claim 5, comprising using the optical method to measure the actual position data of the second marker structure.

7. The method of claim 1, comprising using an optical method to measure the actual position data of the second marker structure, wherein the optical method comprises using illumination radiation with a wavelength selected from the group consisting of the UV range, the VUV range, the DUV range, and the EUV range.

8. The method of claim 1, comprising:
a) measuring an arrangement of the first marker structure on the substrate with an image field with a first area; and
b) after a), measuring an arrangement of the first marker structure on the substrate with an image field with a second area,
wherein the second area is less than the first area.

9. The method of claim 1, comprising:
a) using illumination radiation having a first wavelength to establish an arrangement of the first marker structure on the substrate; and
b) after a), measuring the arrangement of the first marker structure on the substrate using illumination radiation with a second wavelength,
wherein the second wavelength is less than the first wavelength.

10. The method of claim 1, wherein the second marker structure comprises a marker structure selected from the group consisting of a fiducial marker, a scanner alignment mark, a structure of a lithography mask, and a defect on a mask blank.

11. The method of claim 1, wherein the transformation comprises at least one member selected from the group consisting of a linear transformation, a rigid-body transformation, a scaling, an orthogonal transformation, and a higher-order transformation.

12. The method of claim 1, wherein the transformation comprises a transformation used by a scanner when exposing a wafer.

13. The method of claim 1, wherein the second marker structure comprises the first marker structure.

14. The method of claim 1, wherein the first marker structure comprises alignment marks of a lithography mask, and the second marker structure comprises scanner alignment marks for aligning the lithography mask.

15. The method of claim 1, wherein measuring the actual position data of the second marker structure in the substrate coordinate system comprises establishing an actual position in a region of the used structure of the lithography mask in the substrate coordinate system.

16. The method of claim 1, wherein the first and second marker structures comprise fiducial marks of a mask blank, and the substrate coordinate system defines a mask blank coordinate system.

17. The method of claim 16, comprising predetermining position data of defects of the mask in a data record.

18. The method of claim 17, wherein measuring the actual position data of the second marker structure comprises using the position measurement system to measure actual positions of defects of the mask blank in the substrate coordinate system.

19. The method of claim 18, comprising storing the actual positions of the measured defects in a substrate map.

20. The method of claim 1, further comprising using the method to establish an overlay of two lithography masks.

21. The method of claim 1, wherein the substrate is a mask blank, and the method comprises:
predetermining a used structure with specific intended positions; and
establishing a positioning of the used structure on the mask blank so that a plurality of defects are covered by the used structure to reduce an influence of the defects on imaging properties of the completed lithography mask.

* * * * *